(12) United States Patent
Lin et al.

(10) Patent No.: US 8,159,627 B2
(45) Date of Patent: Apr. 17, 2012

(54) PIXEL LAYOUT STRUCTURE FOR RAISING CAPABILITY OF DETECTING AMORPHOUS SILICON RESIDUE DEFECTS AND METHOD FOR MANUFACTURING THE SAME

(75) Inventors: Wei-Chuan Lin, Shen-zhen (CN); Lung-chuan Chang, Shen-zhen (CN)

(73) Assignee: Century Display (Shenzhen) Co., Ltd, Shen-Zhen (CN)

( * ) Notice: Subject to any disclaimer, the term of this patent is extended or adjusted under 35 U.S.C. 154(b) by 374 days.

(21) Appl. No.: 12/405,805

(22) Filed: Mar. 17, 2009

(65) Prior Publication Data
US 2009/0267071 A1 Oct. 29, 2009

(30) Foreign Application Priority Data
Apr. 23, 2008 (CN) .......................... 2008 1 0027628

(51) Int. Cl.
*G02F 1/1333* (2006.01)
(52) U.S. Cl. .......................... 349/54; 349/111
(58) Field of Classification Search ............ 349/43, 349/54, 110–111
See application file for complete search history.

(56) References Cited

U.S. PATENT DOCUMENTS

| 7,758,760 B2* | 7/2010 | Choi et al. ............... 216/57 |
| 2004/0080700 A1* | 4/2004 | Kang ..................... 349/141 |
| 2004/0169812 A1* | 9/2004 | Kim ...................... 349/187 |

* cited by examiner

*Primary Examiner* — Mark Robinson
*Assistant Examiner* — Charles Chang
(74) *Attorney, Agent, or Firm* — Ming Chow; Sinorica, LLC

(57) ABSTRACT

Disclosed is a pixel layout structure capable of increasing the capability of detecting amorphous silicon (a-Si) residue defects and a method for manufacturing the same. Wherein, an a-Si dummy layer is disposed on either one side or both sides of each data line. The design of such an a-Si dummy layer is utilized, so that in an existing testing conditions (by making use of an existing automatic array tester in carrying out the test), in case that there exists an a-Si residue in a pixel, the pixel having defects can be detected through an enhanced capacitance coupling effect and an electron conduction effect. Therefore, through the application of the above-mentioned design, the capability of an automatic array tester can effectively be increased in detecting a defective pixel having a-Si residues.

8 Claims, 23 Drawing Sheets

PIXEL LAYOUT STRUCTURE FOR RAISING CAPABILITY OF DETECTING AMORPHOUS SILICON RESIDUE DEFECTS AND METHOD FOR MANUFACTURING THE SAME

BACKGROUND OF THE INVENTION

1. Field of the Invention

The present invention relates to a technology of detecting amorphous silicon (a-Si) residue defects in a process of manufacturing array substrate, and in particular to a pixel layout structure for raising the capability of detecting amorphous silicon residue defects and method for manufacturing the same.

2. The Prior Arts

In the process of manufacturing Liquid Crystal Display (LCD), the manufacturing of an entire display is achieved through a first section Array manufacturing process, an intermediate section Cell manufacturing process, and a last section Module manufacturing process. The Array manufacturing process includes at least five stages comprising a Gate Electrode (GE) forming stage, a Semiconductor Electrode (SE) forming stage, a Source & Drain Electrode (SD) forming stage, a Contact Hold (CH) forming stage, and a Pixel Electrode (PE) forming stage. The mask used by each of the stages as mentioned above requires going through the processes of filming, lithography, etching, and peeling. These processes need to be repeated for five times in order to form a thin-film-transistor (TFT) array substrate.

Up to the present, a conventional thin film liquid crystal display is composed of a thin film transistor (TFT element switch) made of an a-Si layer, a storage capacitor (Cst), and a transparent conductive electrode made of ITO or IZO. While a voltage difference is applied between an upper and a lower substrate, liquid crystal would be driven by the voltage difference in producing an optical rotation effect. As such, the slant angle of liquid crystal is realized through the applied voltage, and in conjunction with a color filter having an array-type light source of red, green, and blue colors and the signal controlling over each gate line and data line, a pixel coupled with the assigning light would produce single colored spot, thus a planar display color effect is created through the combination of these pixels with various colored spots. When defects occur in a pixel, a voltage difference cannot be stably maintained between an upper substrate and a lower substrate to drive liquid crystal in producing optical rotations, so that the pixels on a planar display will present distributions of uncontrollable bright spots and dark spots or even gray spots, thus degrading the image display quality of a liquid crystal display. For this reason, liquid crystal displays are subject to severe electrical property tests before they can be delivered to customers.

An automatic Array Tester has a main function focusing on the electrical property test of an active area, and that is used to discover various defects produced in a manufacturing process. For an Array Testing, an a-Si residue means the pixel defects caused by certain drawbacks occurring in an a-Si layer manufacturing process, such as foreign materials before a-Si deposition, poor quality of a-Si layer development, and residue of a-Si etching etc., and that is also a major bottleneck affecting the yield rate of an Array manufacturing process. When an a-Si residue 10 occurs in a pixel and overlaps with a data line 12 as shown in FIGS. 1A & 1B, analyzing its pixel circuit diagram as referred in FIG. 1C, each pixel includes a transistor (TFT), a storage capacitor ($C_{st}$), and a parasitic capacitor ($C_{gd}$); and due to the existence of a-Si residue 10, therefore a capacitor $C_{AS\text{-}ITO}$ exists due to the a-Si residue overlapping with ITO. From the above discussion it can be discovered that, the voltage drop $V_{AS\text{-}Residue}$ resulted from the a-Si residue 10 existing in a pixel is proportional to the area of a-Si residue 10 (related to $C_{AS\text{-}ITO}$) and voltage ($V_{Data}$) as supplied by a data line 12.

In a normal testing condition, the test capability may decrease significantly depending on the decreasing sizes of areas of a-Si residues. In case that the area of a residue is larger than ⅓ of a pixel area, then the chance for detecting the residue may reach 95%; if the area is less than ⅓ but larger than 1/24 of a pixel area, the chance of detection may range between 70-95%; otherwise in case that the area is less than 1/24 of a pixel area, then the chance for detecting the residue may drop below 50%. For an ordinary testing capability, it would not be easy to detect the pixel defect caused by the a-Si residue in an Array manufacturing process in case that the residue area is less than ⅓ of a pixel area, therefore, some pixel residue defect could have originally had a chance of being detected and repaired to normal status in an Array manufacturing process, failing detection and repair would make the unrepair defect flow to a subsequent manufacturing process, such that the pixel defect can only be detected in a Cell manufacturing process and repaired to become a dark spot, even more, the defect would be remained and flow into the last Module manufacturing process to become a bright spot defect.

Furthermore, in case that an a-Si residue pixel defect is detected in a subsequent Cell manufacturing process instead of being detected and repaired in an Array manufacturing process, it would cause more loading to a Cell repair and cassette transportation. In case that an a-Si residue pixel defect is not detected and repaired in both the Array manufacturing process and Cell manufacturing process, yet it is detected in a Module manufacturing process, these panels may not be repaired any more due to the bright spots defects formed by the a-Si residue in pixel, further resulting in downgraded panel products and increasing the risk of panel quality degradation. Or even worse, in case that the produced panels having a-Si residue pixel defects are delivered to the customers without being detected and repaired in any stage of the Array manufacturing process, the Cell manufacturing process, and the Module manufacturing process, it would result in instability, unreliability of panel quality control, and putting the credibility of the entire panel quality control in question.

SUMMARY OF THE INVENTION

In view of the problems and shortcomings of the prior arts, the present invention provides a pixel layout structure for raising the capability of detecting amorphous silicon residue defects and method for manufacturing the same.

A major objective of the present invention is to provide a pixel layout structure for raising the capability of detecting amorphous silicon residue defects and method for manufacturing the same. In the present invention, a panel design layout is utilized, moreover, a design of a-Si dummy layer is added, so that under the conventional test conditions, whenever a-Si residues exist in a pixel, the capacitor coupling effect and electron conduction effect between the dummy layer and the a-Si residue could be increased, hereby detecting those pixels with defects.

Another objective of the present invention is to provide a pixel layout structure for raising the capability of detecting amorphous silicon residue defects, that can be used to increase the capability of an automatic Array Tester in detecting the pixel defects caused by a-Si residues, so as to raise the production yield and increase the stability of quality control of panels.

Yet another objective of the present invention is to provide a pixel layout structure capable of raising the capability of detecting amorphous silicon residue defects, that is used to reduce the repair loading in the subsequent Cell manufacturing process, hereby preventing the downgrading of the sold out panel's quality due to bright spots, increasing revenue of sales of panels, and alleviating the problem of rejection of panels as caused by the bright spots.

In order to achieve the above-mentioned objective, the present invention provides a pixel layout structure capable of raising the capability of detecting amorphous silicon residue defects, comprising a transparent substrate; a first metal layer disposed on the transparent substrate to form a pattern of a gate line, a gate electrode of a transistor, and at least a shadow layer; a first insulation layer disposed on the first metal layer; and an a-Si layer deposited on the first insulation layer, thereby forming a channel of the transistor and at least a dummy layer, and the dummy layer is disposed above the shadow layer; a second metal layer sputtered on the a-Si layer, hereby forming a data line and a source electrode and a drain electrode of the transistor; moreover, a second insulation layer disposed on the second metal layer, and having a plurality of through holes; and a transparent conductive layer disposed on the second insulation layer, whereby the drain electrode of said transistor is electronically connected with said transparent conductive layer via the through holes. Since an a-Si dummy layer may be disposed on one side or both sides of the data line, thus when an a-Si residue exists in a pixel, the area of the a-Si residue would be increased by overlapping the a-Si dummy layer.

In addition, the present invention also provides a method of manufacturing a pixel layout structure, comprising the following steps: firstly, providing a transparent substrate and forming a first metal layer on the transparent substrate, then etching said first metal layer to from a pattern of a gate line, a gate electrode of a transistor and at least a shadow layer; next, forming a first insulation layer on the first metal layer; then, forming an a-Si layer on the first insulation layer, and etching said a-Si layer to form a channel of the transistor and at least a dummy layer, wherein the dummy layer is disposed above the shadow layer; subsequently, forming a second metal layer on the a-Si layer, and etching said second metal layer to form a data line and a source electrode and a drain electrode of the transistor; then, forming a second insulation layer on the second metal layer, and etching said second insulation layer to form a plurality of through holes; and finally, forming a transparent conductive layer on the second insulation layer, so that the transparent conductive layer is electronically connected with the drain electrode via the through holes.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

BRIEF DESCRIPTION OF THE DRAWINGS

The related drawings in connection with the detailed description of the present invention to be made later are described briefly as follows, in which.

DETAILED DESCRIPTION OF THE PREFERRED EMBODIMENT

The purpose, construction, features, functions and advantages of the present invention can be appreciated and understood more thoroughly through the following detailed description with reference to the attached drawings.

When a light-on detection of cell testing is performed to the panels after assembling, in case that an a-Si residue exists in a pixel, the bright spot defects will present in a gray level test. At the mean time, it would be necessary to make these panels which have pixel defects go back to the Cell manufacturing process and repair them into the dark spots. However, this repair procedure would inevitably increase the work load of the cell manufacturing process. In addition, according to statistics of the residue areas detected in cell tests, it is found that most of the areas of a-Si residues are less than ⅓ of the pixel area, and that is quite sufficient to reveal the shortcomings that a conventional Array Tester may fail to detect the defects and repair them when the a-Si residue areas are overly small. Therefore, an a-Si dummy layer is added in the present invention, once an a-Si residue exists in a pixel, the residue area is increased and both of its capacitance coupling effect and electron conduction effect would be enhanced, which make it possible to detect those defective pixels with overly small a-Si residue areas under the conventional testing conditions.

In the present invention, a pixel layout structure capable of raising the capability of detecting amorphous silicon residue defects is provided, including a plurality of pixels arranged in an array. In the followings, a structure of a single pixel electrode is taken as an example in explaining the technical characteristics of the present invention in detail.

Figure 1A:
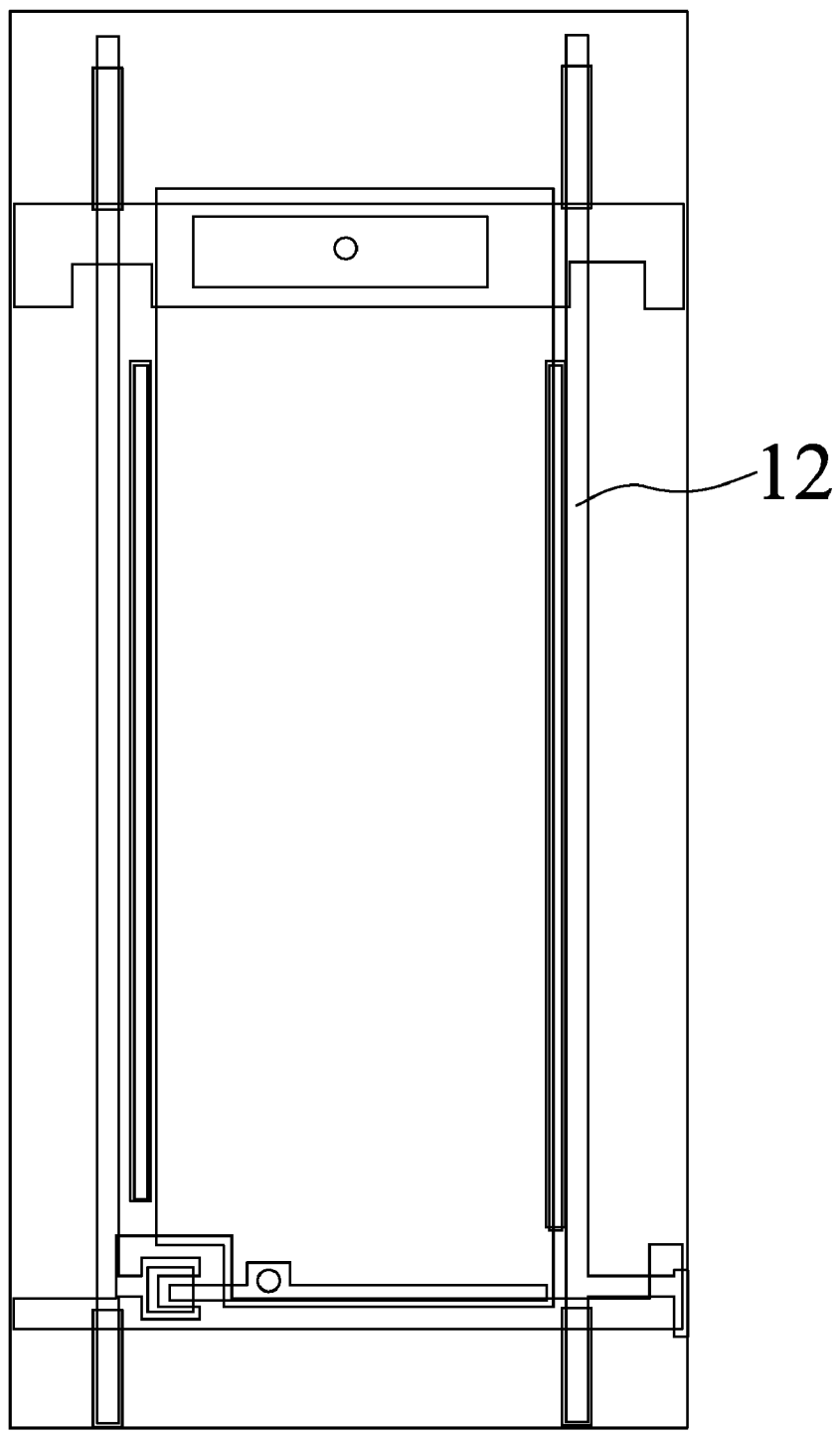
FIG. 1A is a schematic diagram of a layout of a single pixel according to the prior art.
Figure 1B:
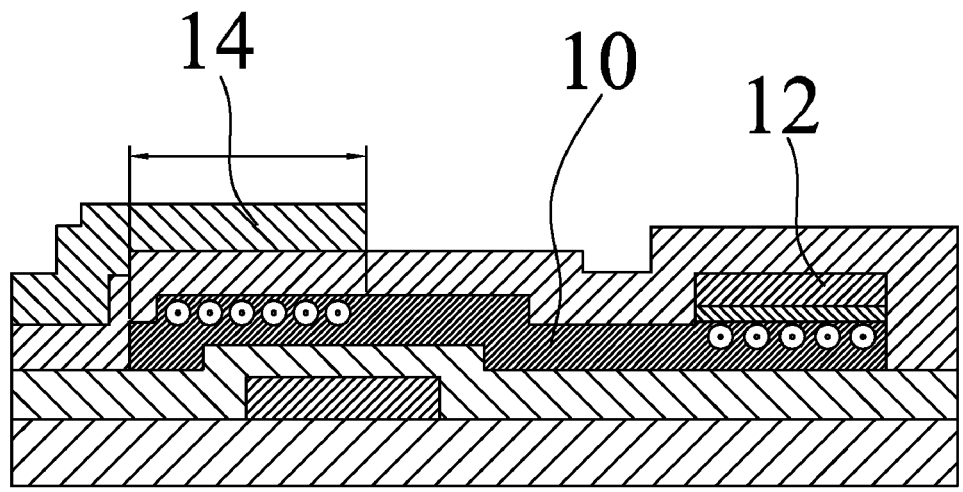
FIG. 1B is a cross section view of a portion of a single pixel as shown in FIG. 1A.
Figure 1C:
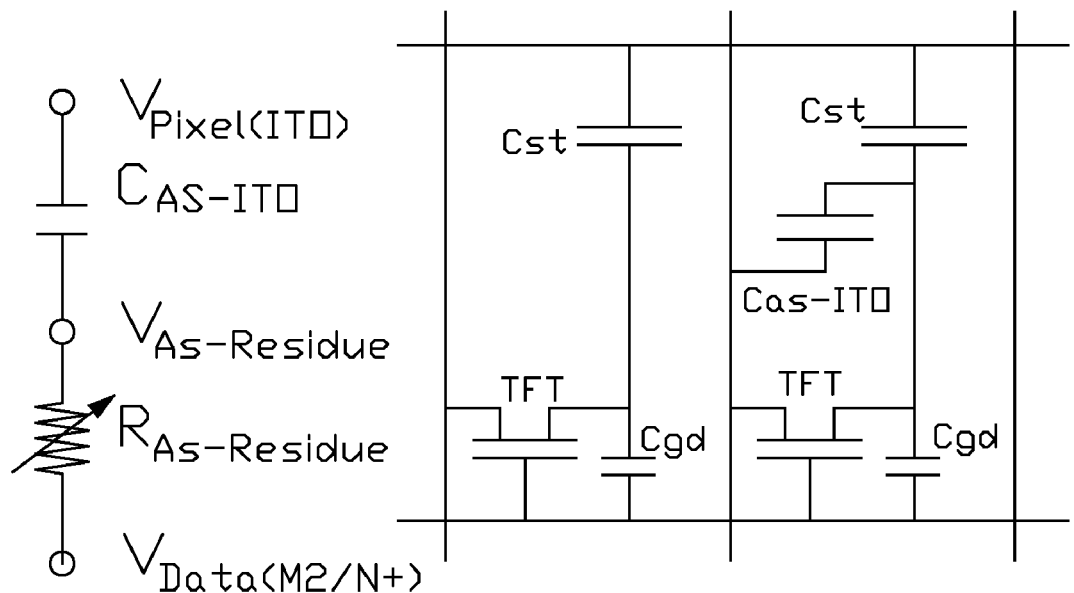
FIG. 1C is an equivalence circuit of a pixel as shown in FIG. 1B.
Figure 2A:
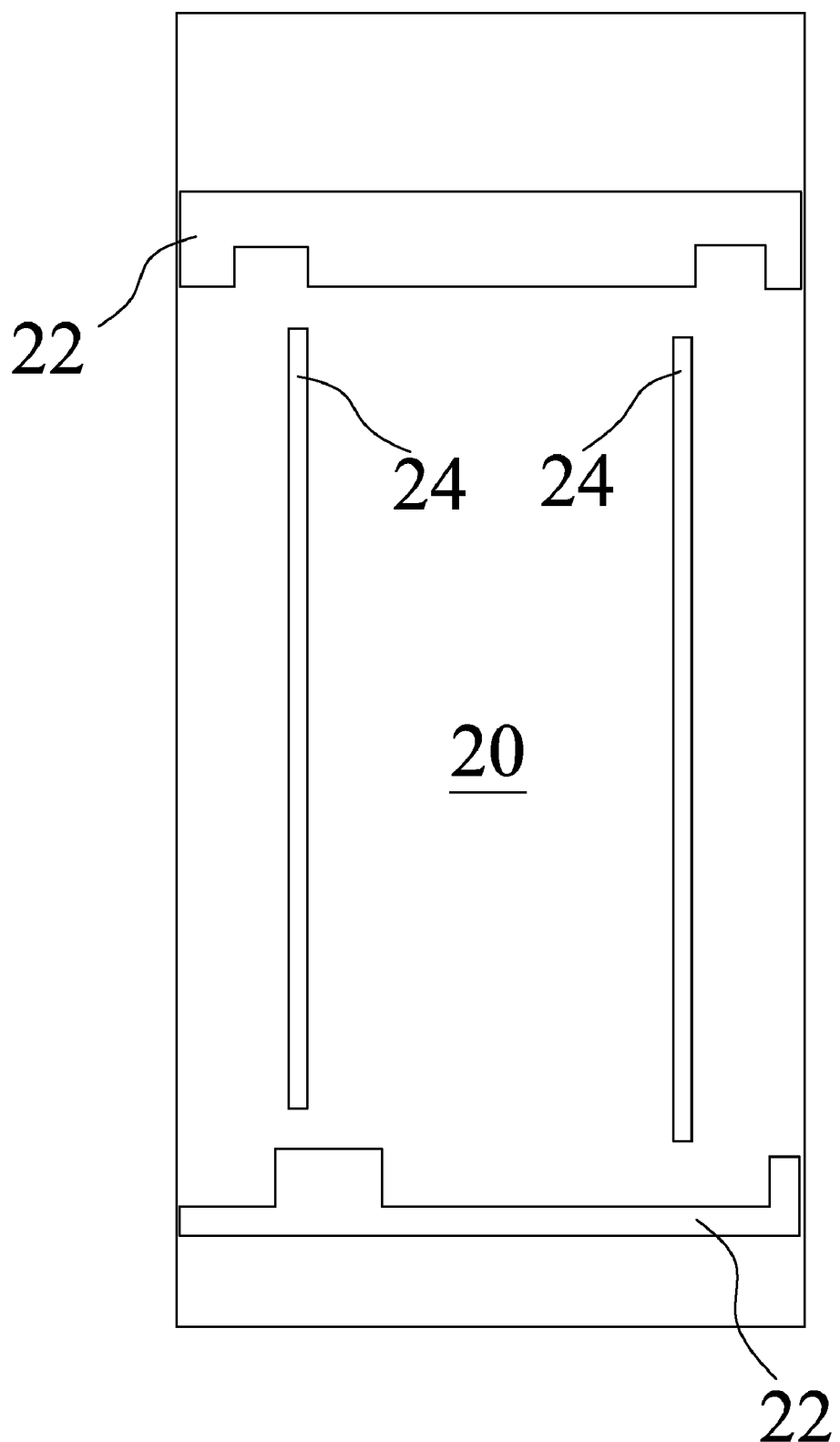
FIGS. 2A to 2E are top views of pixel layout structures for each of the manufacturing steps according to an embodiment of the present invention.
Figure 2B:
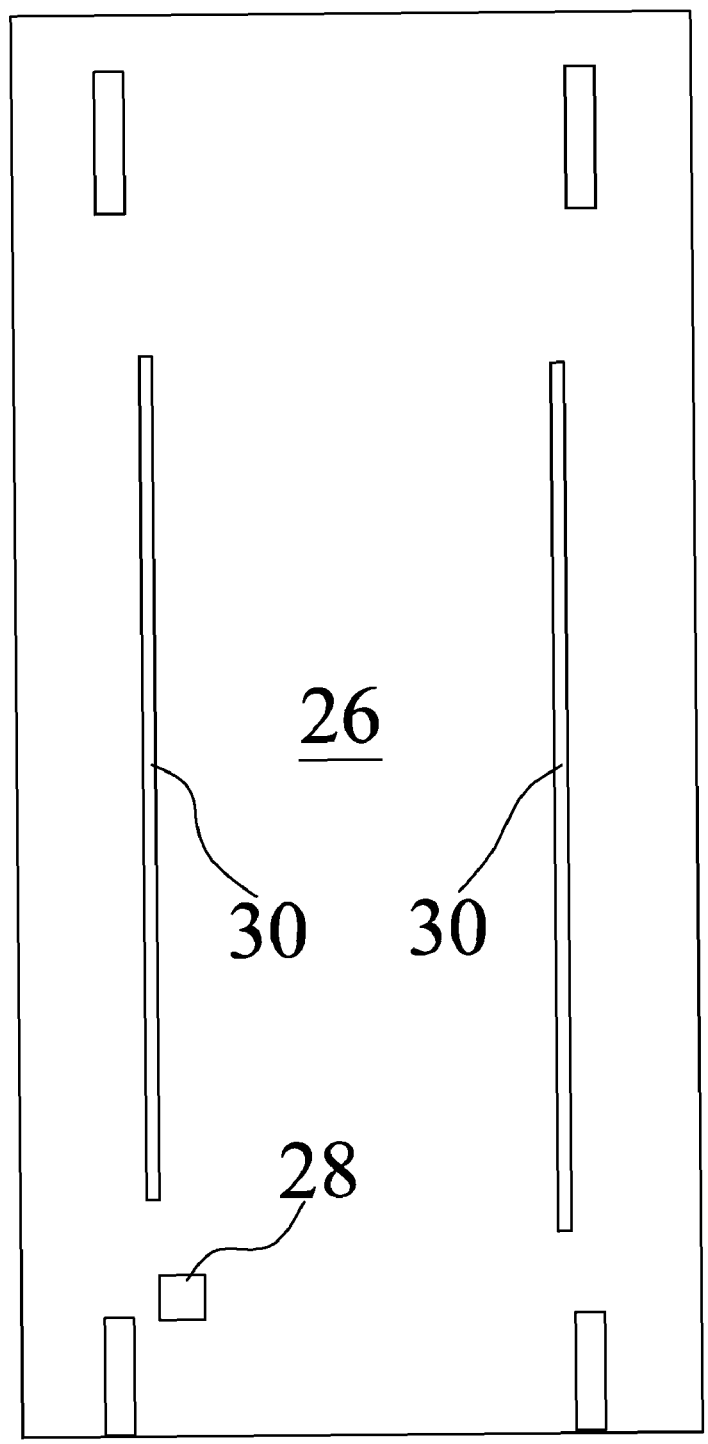
Figure 2C:
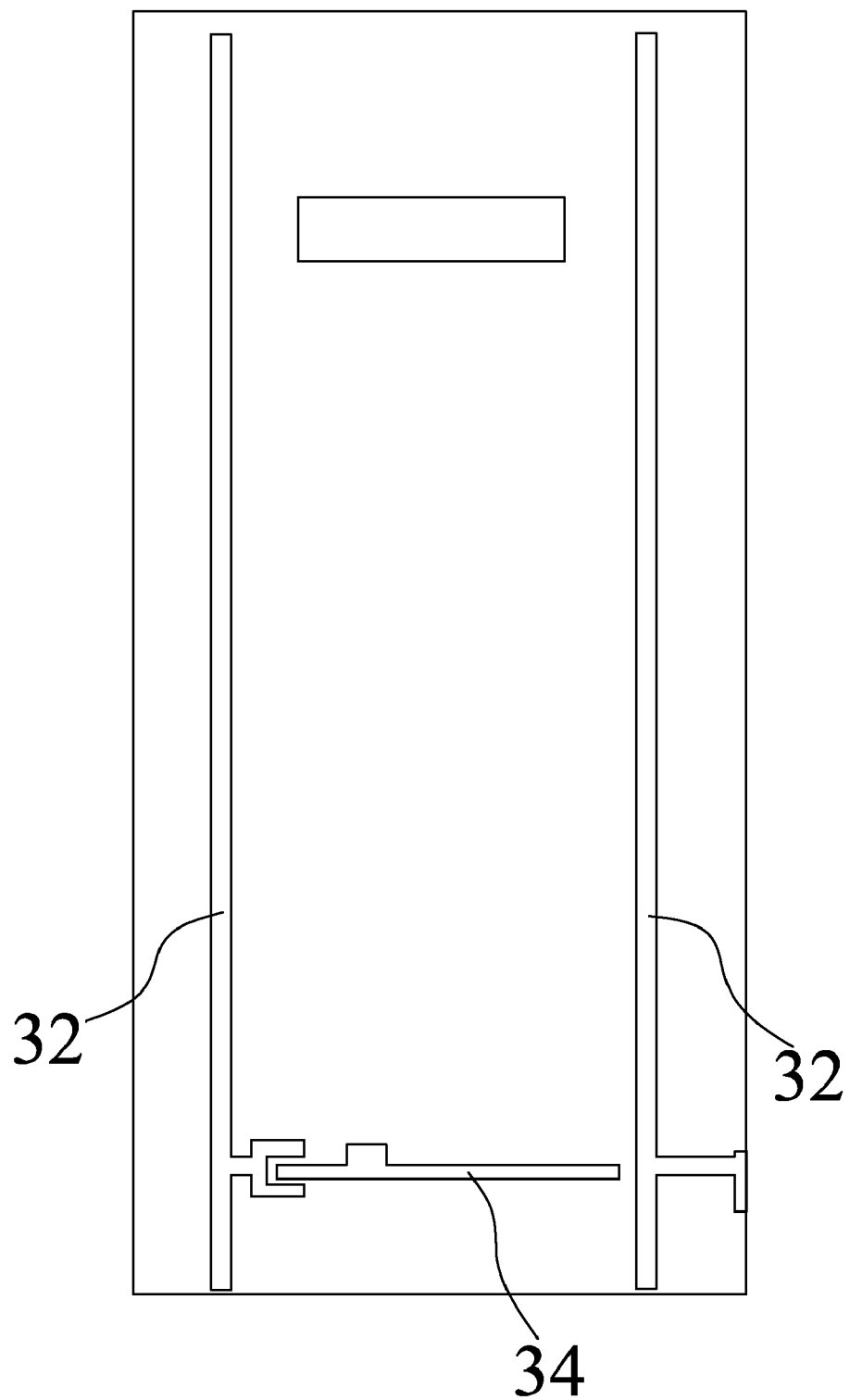
Figure 2D:
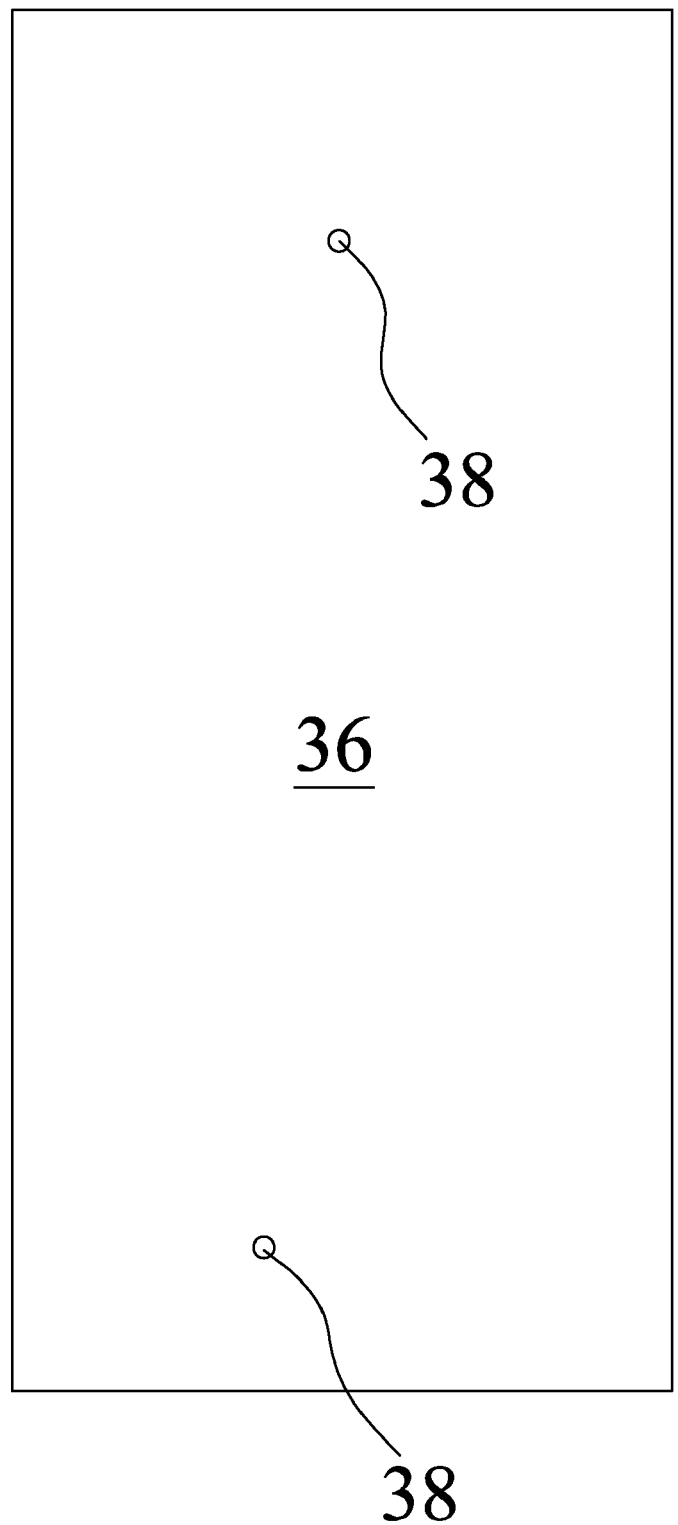
Figure 2E:
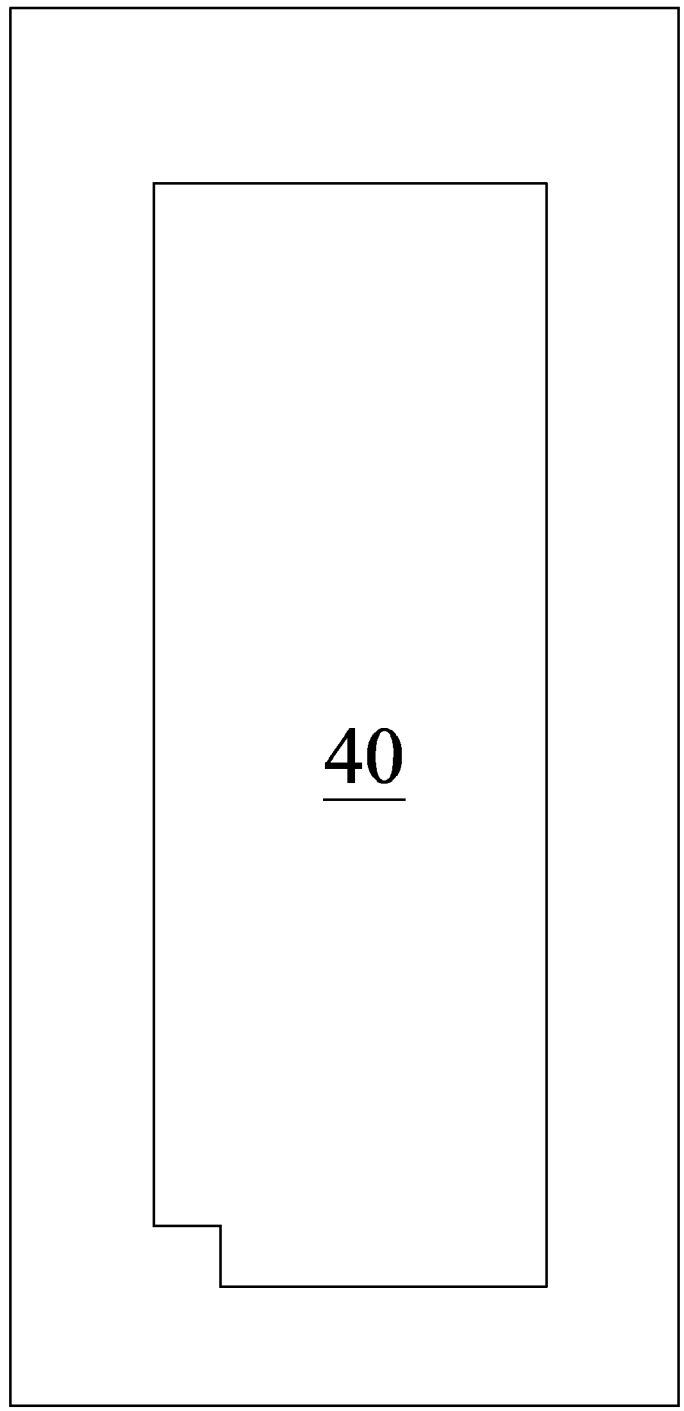

Referring to FIGS. 2A to 2E are the top views of pixel layout structures for each of the manufacturing steps according to an embodiment of the present invention. As shown in FIG. 2A, the first step includes providing a transparent substrate 20, such as a glass substrate; then forming a gate line 22, a gate electrode of a transistor and a shadow layer 24 through a wet etching or a dry etching after growing a first metal layer on the transparent substrate 20. Next, referring to FIG. 2B, depositing and forming a first insulation layer 26 on the first metal layer by means of chemical vapor deposition (CVD); then, depositing to form an a-Si layer on the first insulation layer 26, and forming a channel 28 of a thin film transistor and an a-Si dummy layer 30 through a wet etching or a dry etching, and the a-Si dummy layer 30 is located correspondingly over the shadow layer 24. Furthermore, as shown in FIG. 2C, growing a second metal layer on the a-Si layer, and forming a data line 32 and a source electrode and a drain electrode 34 of the transistor through a wet etching or a dry etching. Subsequently, referring to FIG. 2D, depositing a second insulation layer 36 on the second metal layer, and forming a plurality of through holes 38 by means of a wet etching or a dry etching, hereby electronically connecting the pixel and the storage capacitor. Finally, as FIG. 2E shows, the last step includes forming a transparent conductive layer 40 on the second insulation layer 36, so that the transparent conductive layer 40 is electronically connected with the drain electrode 34 of said transistor via the through holes 28. Wherein, either the first insulation layer 26 or the second insulation layer 36 are made of dielectric materials of silicon oxide or silicon nitride.

Figure 3:
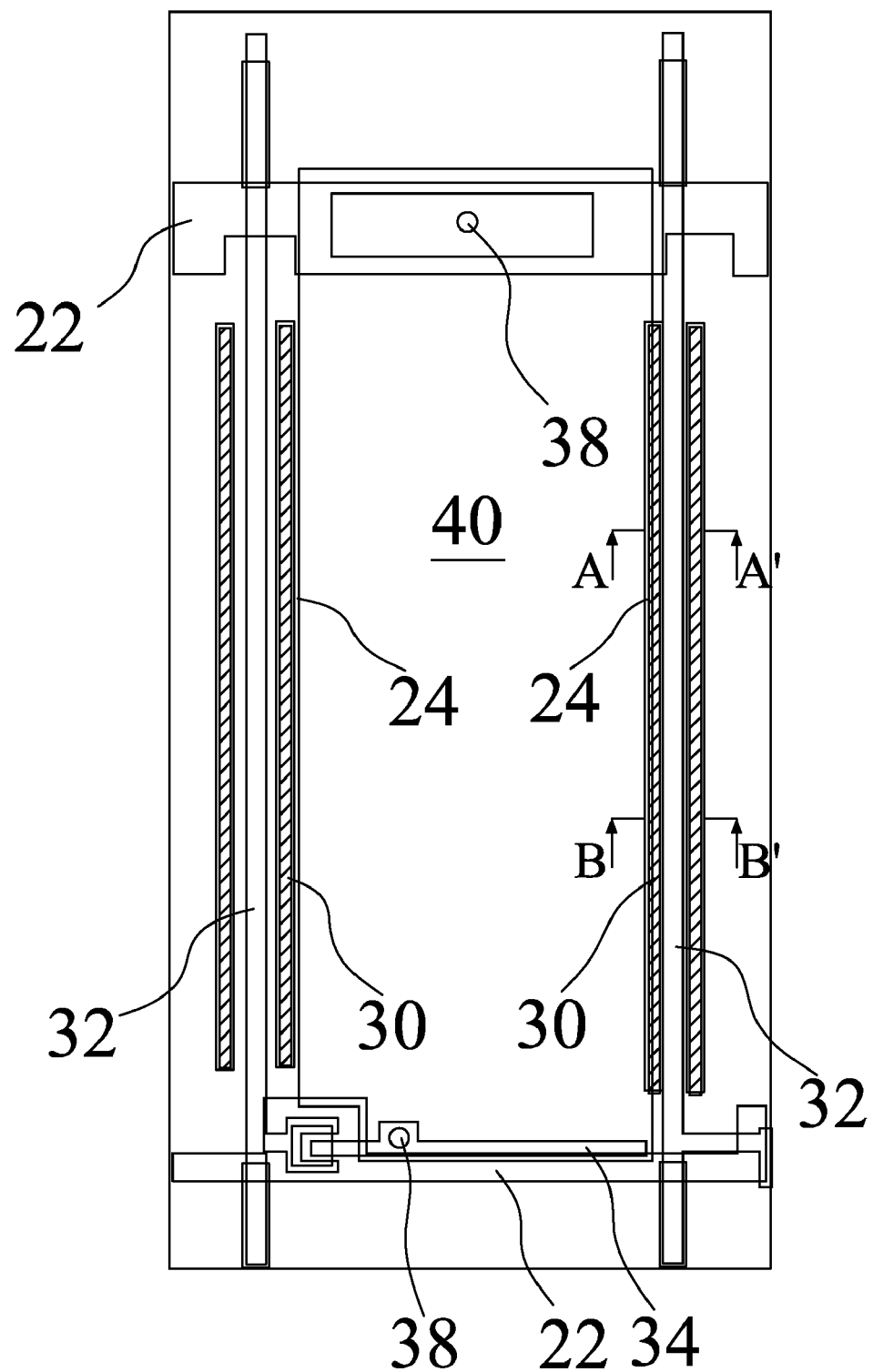
FIG. 3 is a schematic diagram of a single pixel layout structure according to an embodiment of the present invention.
Figure 4A:
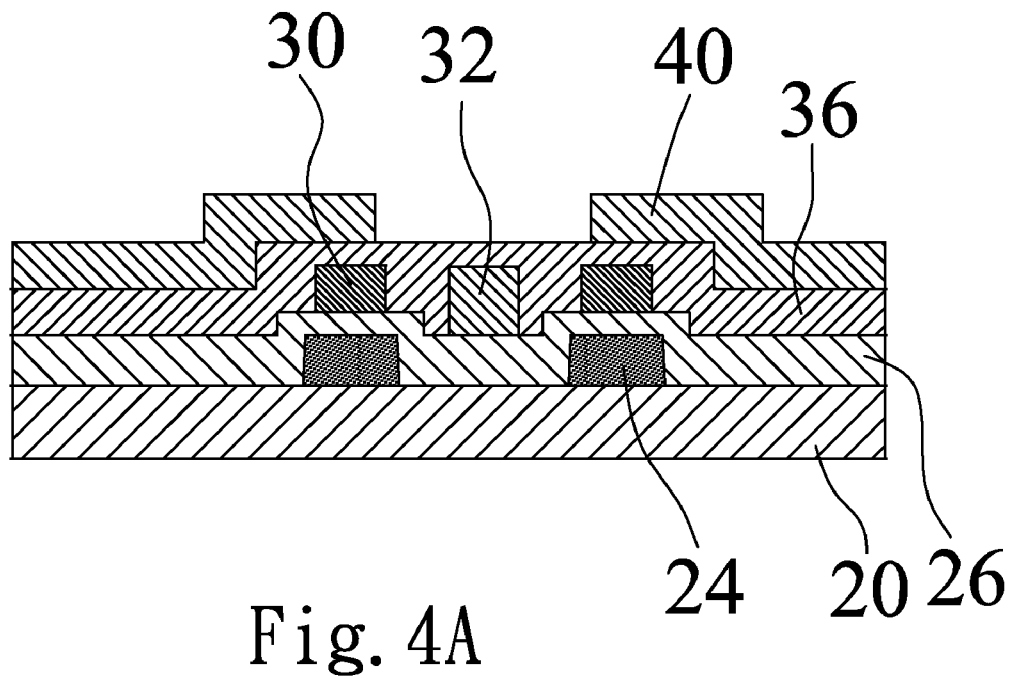
FIG. 4A is a cross section view of a single pixel layout structure along A-A' line as shown in FIG. 3.
Figure 4B:
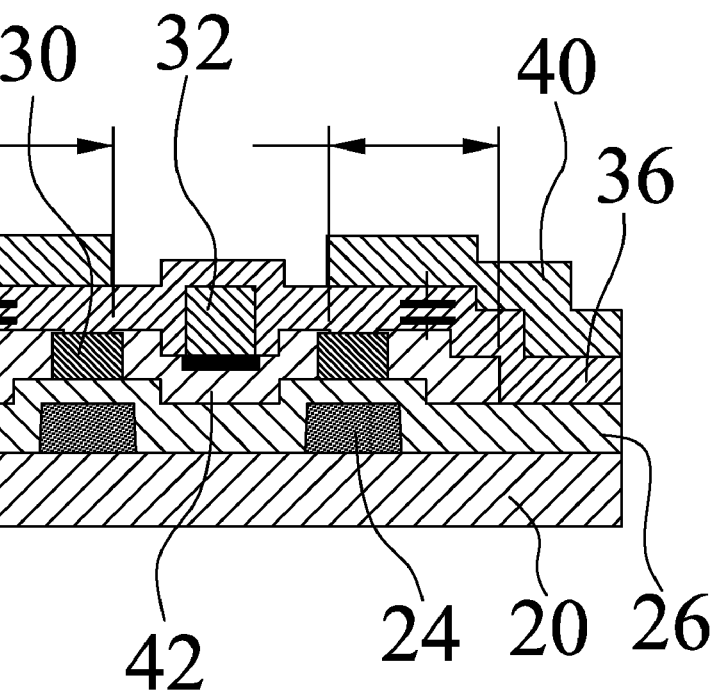
FIG. 4B is a cross section view of a single pixel layout structure along B-B' line as shown in FIG. 3.

The pixel layout structure produced by the above-mentioned steps is as shown in FIG. 3. Please also referring to FIG. 4A, which shows a cross section view of a single pixel layout structure along an A-A' line of FIG. 3. As shown in FIGS. 3 & 4A, the pixel layout structure of the present invention is disposed on a transparent substrate 20, and having a shadow layer 24 made of the first metal layer provided on its surface, and a first insulation layer 26 being disposed thereon. On the first insulation layer 26 is provided with a data line 32 made of a second metal layer, and an a-Si dummy layer 30 is disposed on both sides of the data line 32 and on the first insulation layer 26, on the a-Si dummy layer 30 is provided with a second insulation layer 36, and on its top is provided with a transparent conductive layer 40. In case that a data line 32 is overlapped with an a-Si residue 42, referring to FIG. 4B, it is shown that there exists a layer of a-Si residue 42 between the data line 32 and the first insulation layer 26. As such, in addition to the area of an abnormal a-Si residue 42 itself, it is also connected with an a-Si dummy layer 30 which is newly added in the present invention, hereby increasing the effective overall area of a-Si residue 42, and enhancing the capacitance coupling effect between the a-Si residue 42 and the transparent conductive layer 40, so that a sustaining voltage of a defective pixel after charging will create stronger capacitance coupling effect, and that will result in much more voltage drop in the defective pixel, thus the sustaining voltage of the defective pixel may be lowered more effectively, hereby improving and efficiently raising the capability of an automatic array tester in detecting the a-Si residues of defective pixels.

In addition, an a-Si dummy layer can either be designed into a one-strip or two-strip structure according to the actual requirements and the layout designs. In case that an a-Si dummy layer is designed to be the two strips structure, then each of said strips is respectively disposed on said first insulation layer which is located at a lateral side of said data line, and under each of the two a-Si dummy layers is correspondingly provided with a shadow layer; moreover, when an a-Si dummy layer is designed to have one strip only, then the strip could be located at either side of the data line, while achieving the similar effect.

Furthermore, since an electrode structure composed of a second metal layer, a second insulation layer, and a transparent conductive layer can be driven either by a manner of storage-capacitor-utilizing-common-wiring (Cs on Com) or a manner of storage-capacitor-utilizing-gate-wiring (Cs on Gate), therefore, the electrode structure of the present invention may be produced through either one of the manufacturing process of "Cs on Com" electrode structure and "Cs on Gate" electrode structure mentioned above. Wherein, in case that the electrode structure is a storage-capacitor-utilizing-common-wiring (Cs on Com) electrode structure, then the layout design of the electrode structure can be chosen from a metal layer-insulation layer-ITO layer (MII) electrode structure, a metal layer-insulation layer-semiconductor layer (MIS) electrode structure, or a metal layer-insulation layer-metal layer (MIM) electrode structure.

In the following paragraph, embodiments for a storage-capacitor-utilizing-common-wiring (Cs on Com) electrode structure and a storage-capacitor-utilizing-gate-wiring (Cs on Gate) electrode structure are respectively disclosed in explaining the pixel layout structure of the present invention.

Figure 5A:
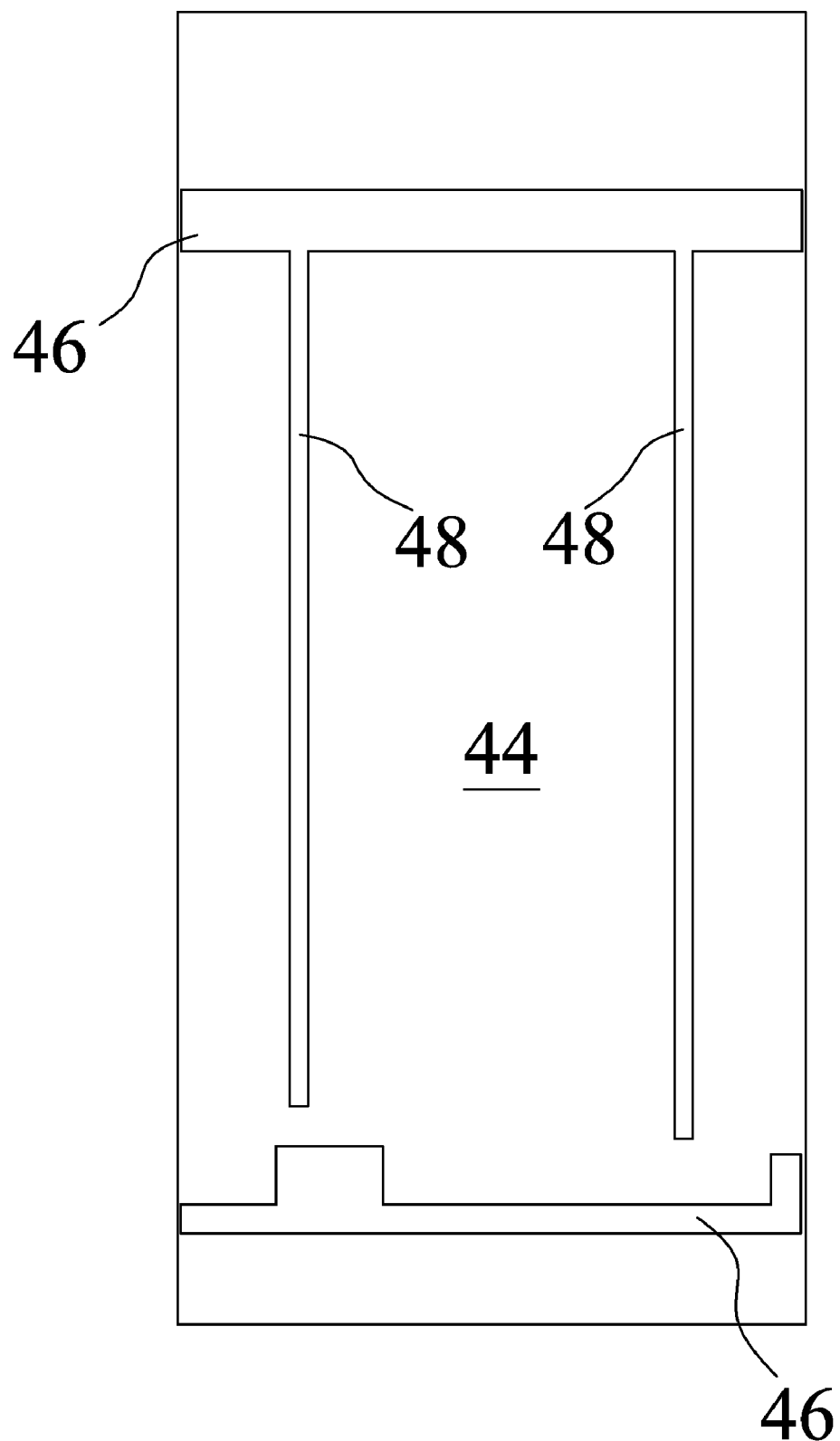
FIGS. 5A to 5F are top views of pixel layout structures for each of the manufacturing steps of an MII electrode structure manufacturing process according to an embodiment of the present invention.
Figure 5B:
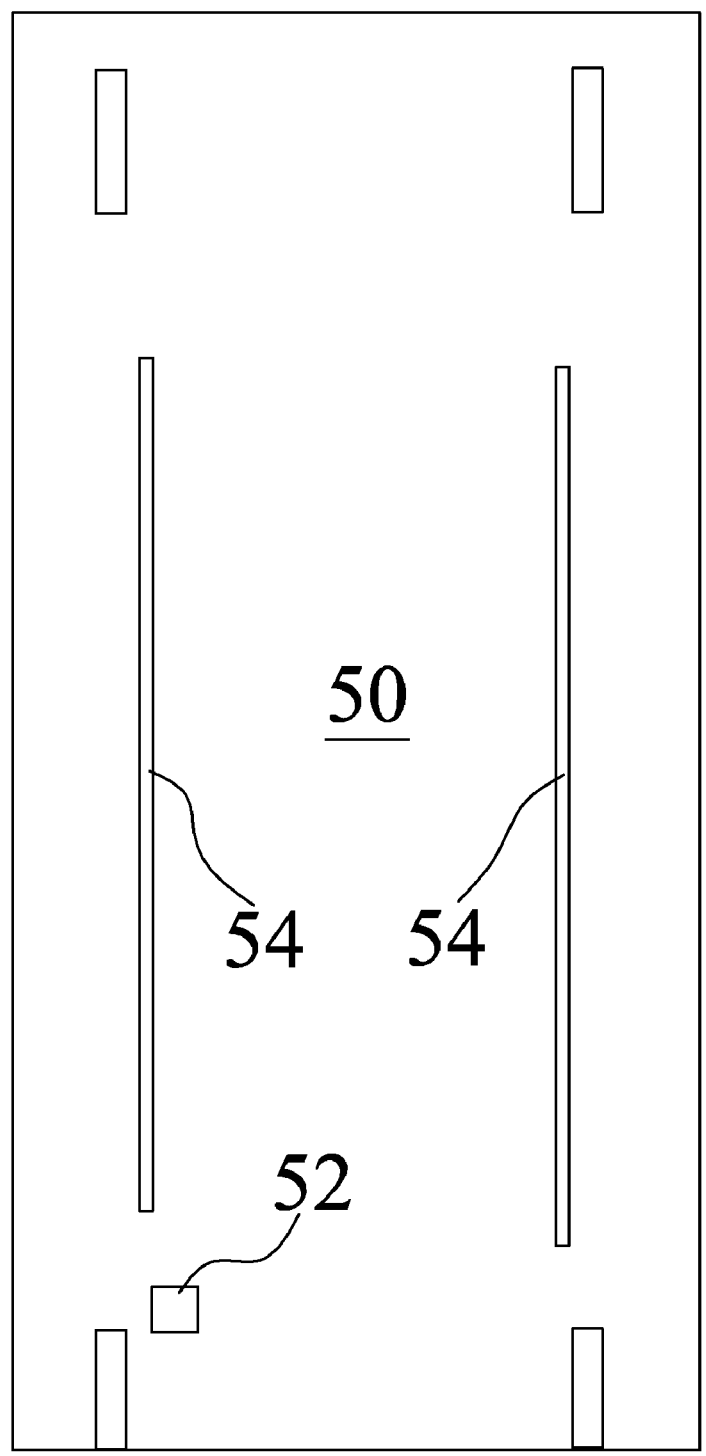
Figure 5C:
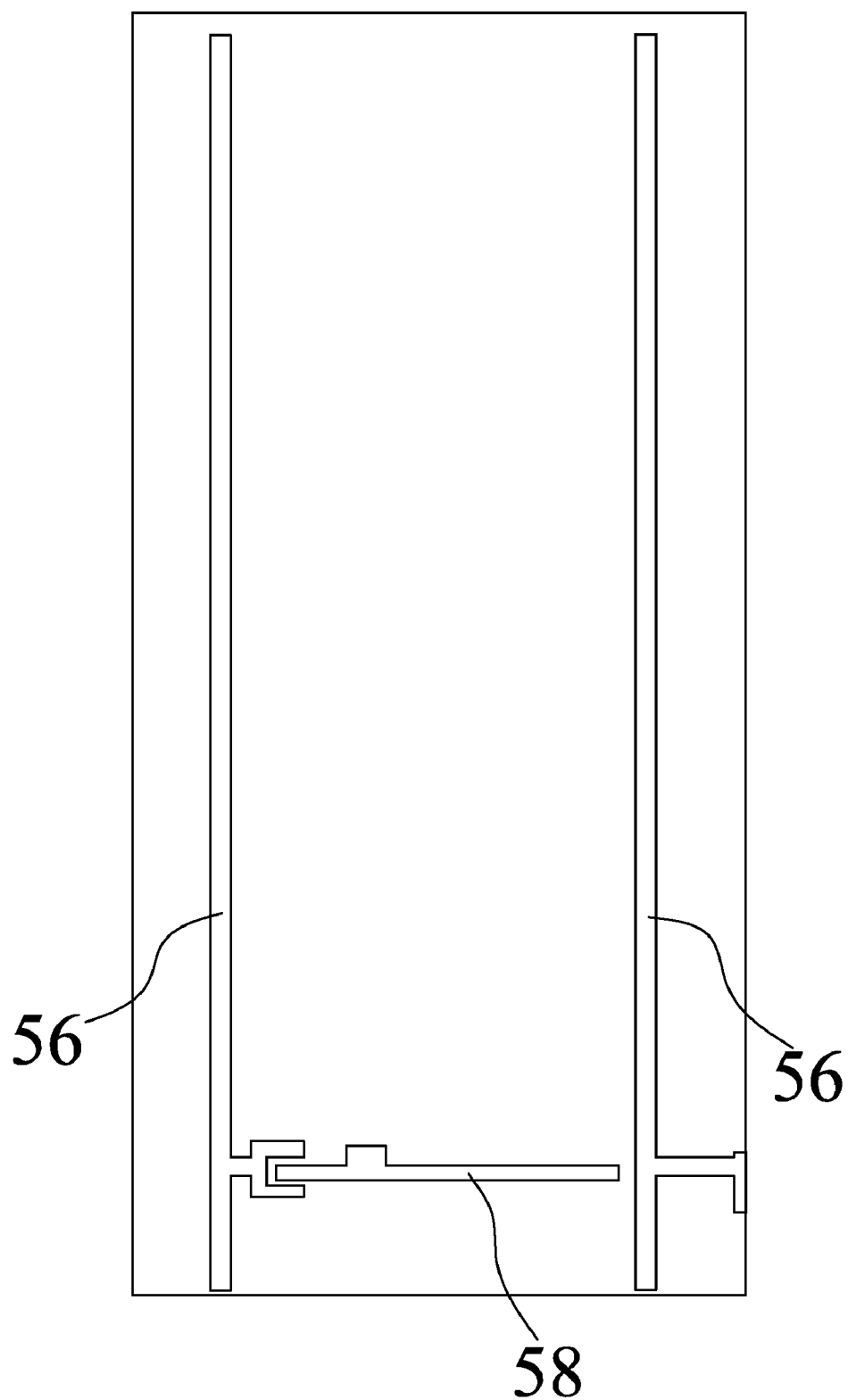
Figure 5D:
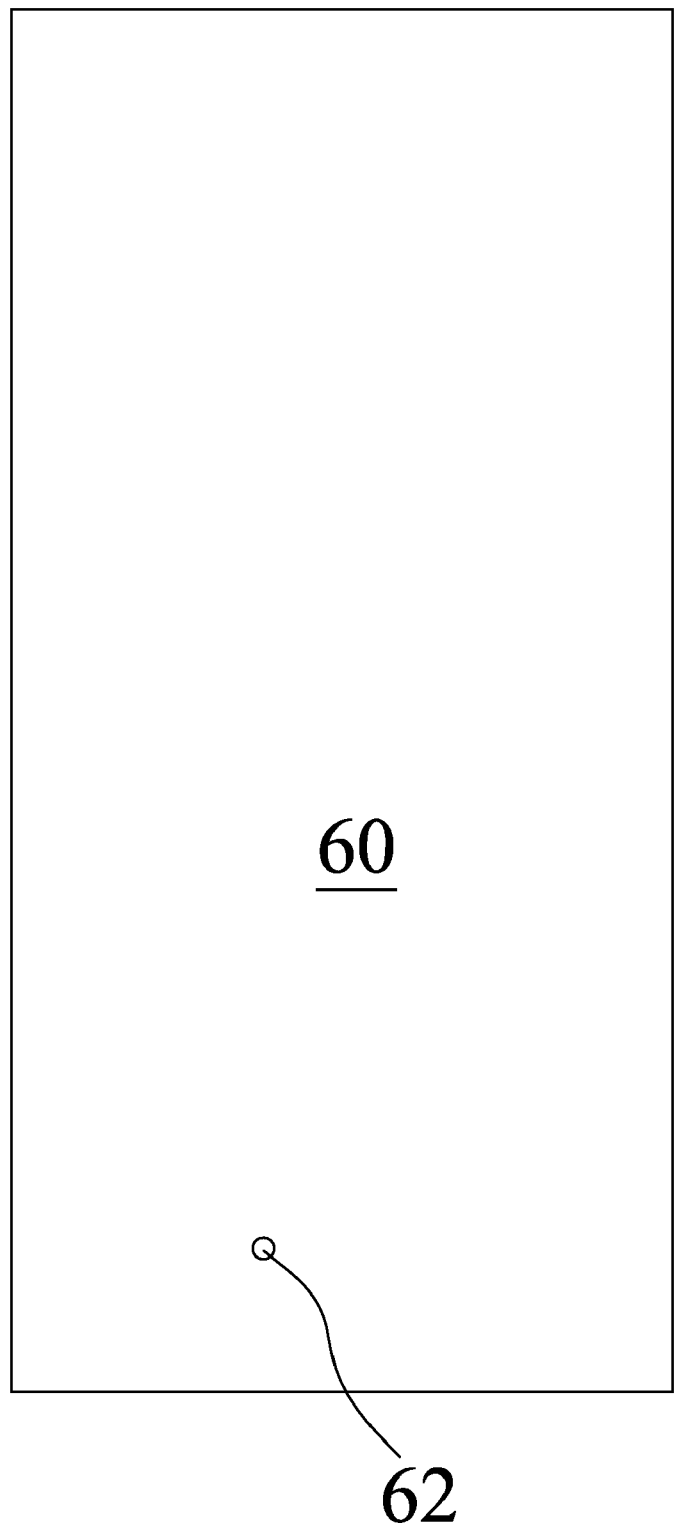
Figure 5E:
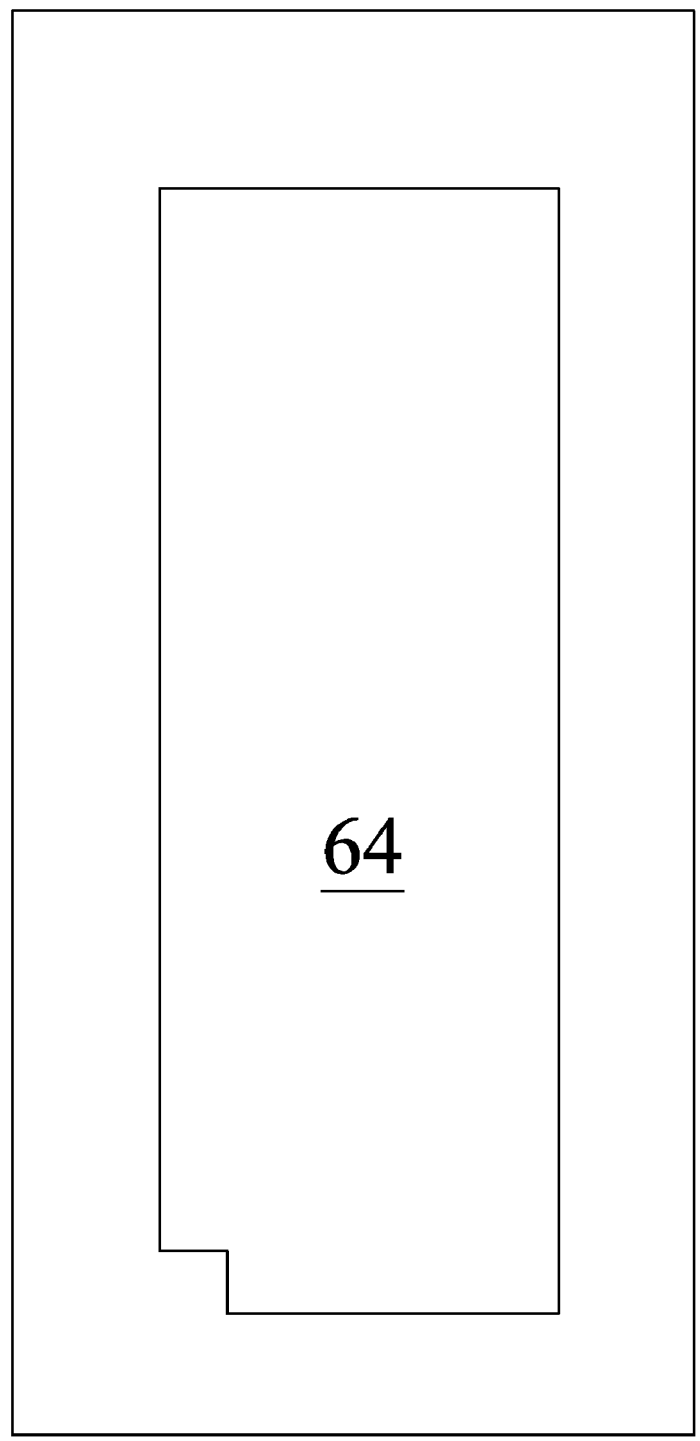
Figure 5F:
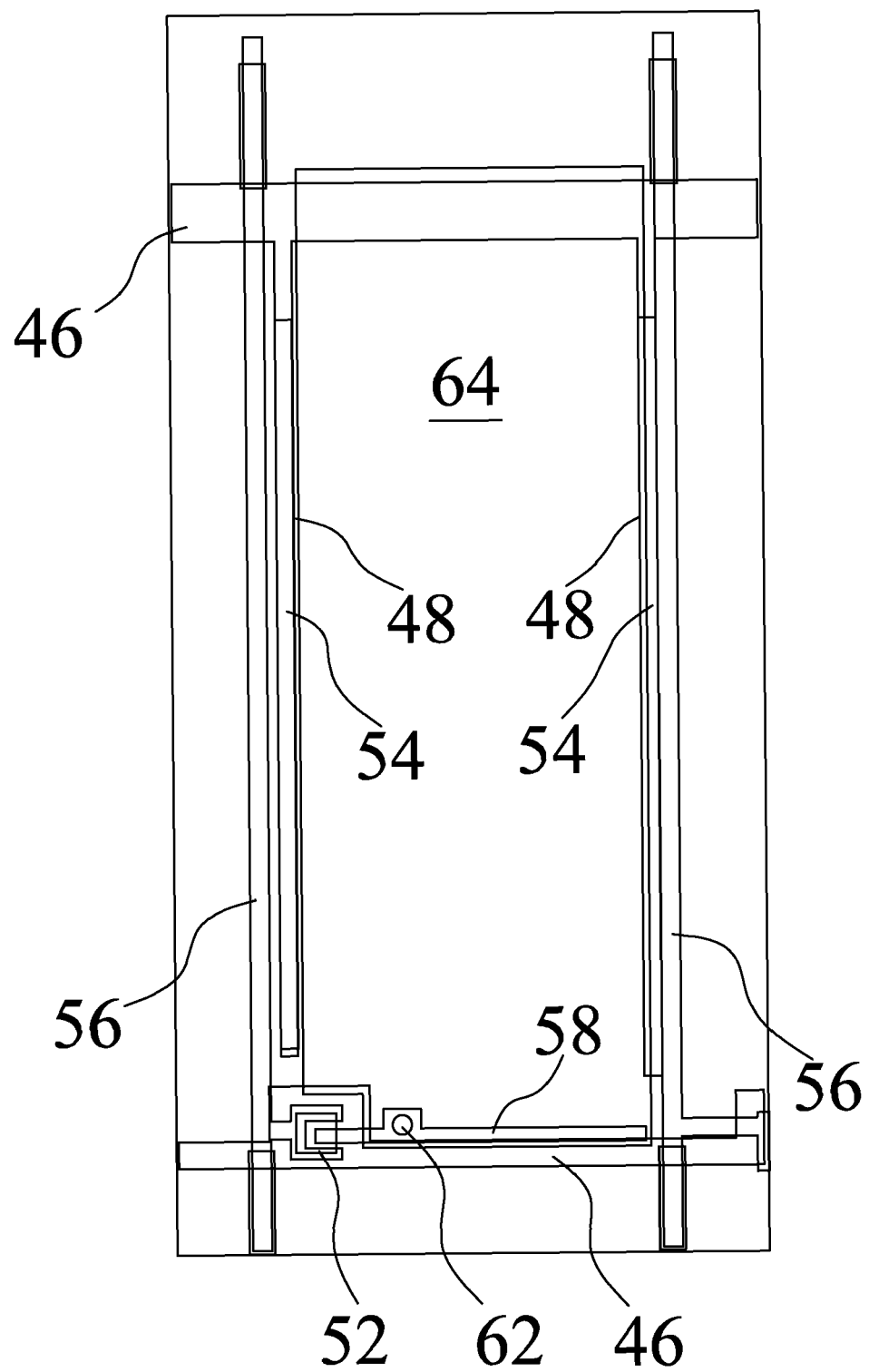

FIGS. 5A to 5E are the top views of pixel layout structures for each of the steps of an MII electrode structure manufacturing process according to an embodiment of the present invention. As shown in FIG. 5A, firstly, providing a transparent substrate 44, such as a glass substrate; then forming a gate line 46, a gate electrode of a transistor and a shadow layer 48 through a wet etching or a dry etching after growing a first metal layer on the transparent substrate 44. Next, referring to FIG. 5B, depositing a first insulation layer 50 on the first metal layer by means of Chemical Vapor Deposition (CVD); then, depositing an a-Si layer on the first insulation layer 50, and forming a channel 52 of a thin film transistor and an a-Si dummy layer 54 through a wet etching or a dry etching, the a-Si dummy layer 54 is located correspondingly over the shadow layer 48. Then, as FIG. 5C shows, growing a second metal layer on the a-Si layer, and forming a data line 56, a source electrode, and a drain electrode 58 of the transistor through a wet etching or a dry etching. Subsequently, referring to FIG. 5D, further depositing a second insulation layer 60 on the second metal layer, and forming a plurality of through holes 62 through a wet etching or a dry etching, hereby electronically connecting a pixel and a storage capacitor. Finally, as FIG. 5E shows, the last step includes forming a transparent conductive layer 64 on the second insulation layer 60, such that the transparent conductive layer 64 is electronically connected with the drain electrode 58 via the through hole 62. The entire pixel layout structure obtained upon the completion of the above-mentioned processes is as shown in FIG. 5F.

Figure 6A:
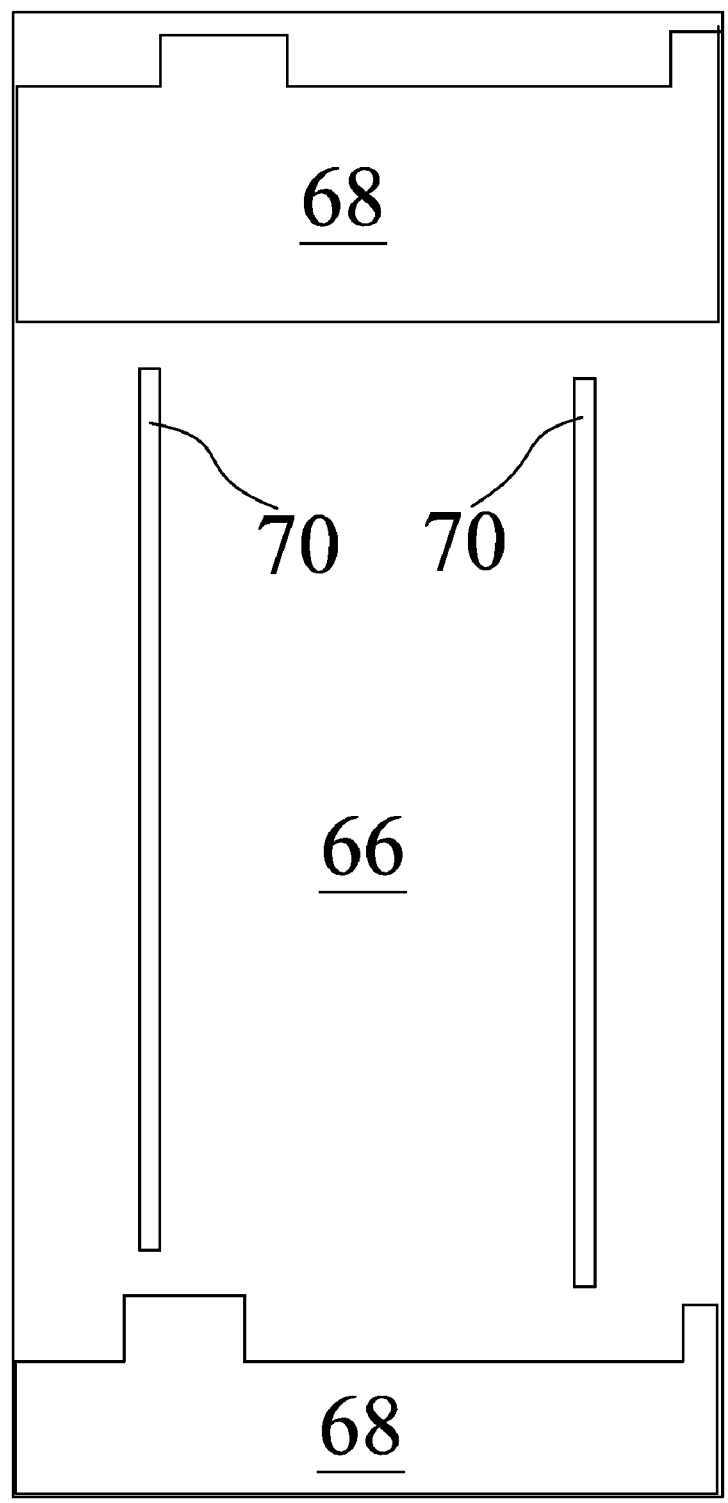
FIGS. 6A to 6F are top views of pixel layout structures for each of the manufacturing steps of a storage-capacitor-utilizing-gate-wiring (Cs on Gate) electrode structure manufacturing process according to an embodiment of the present invention.
Figure 6B:
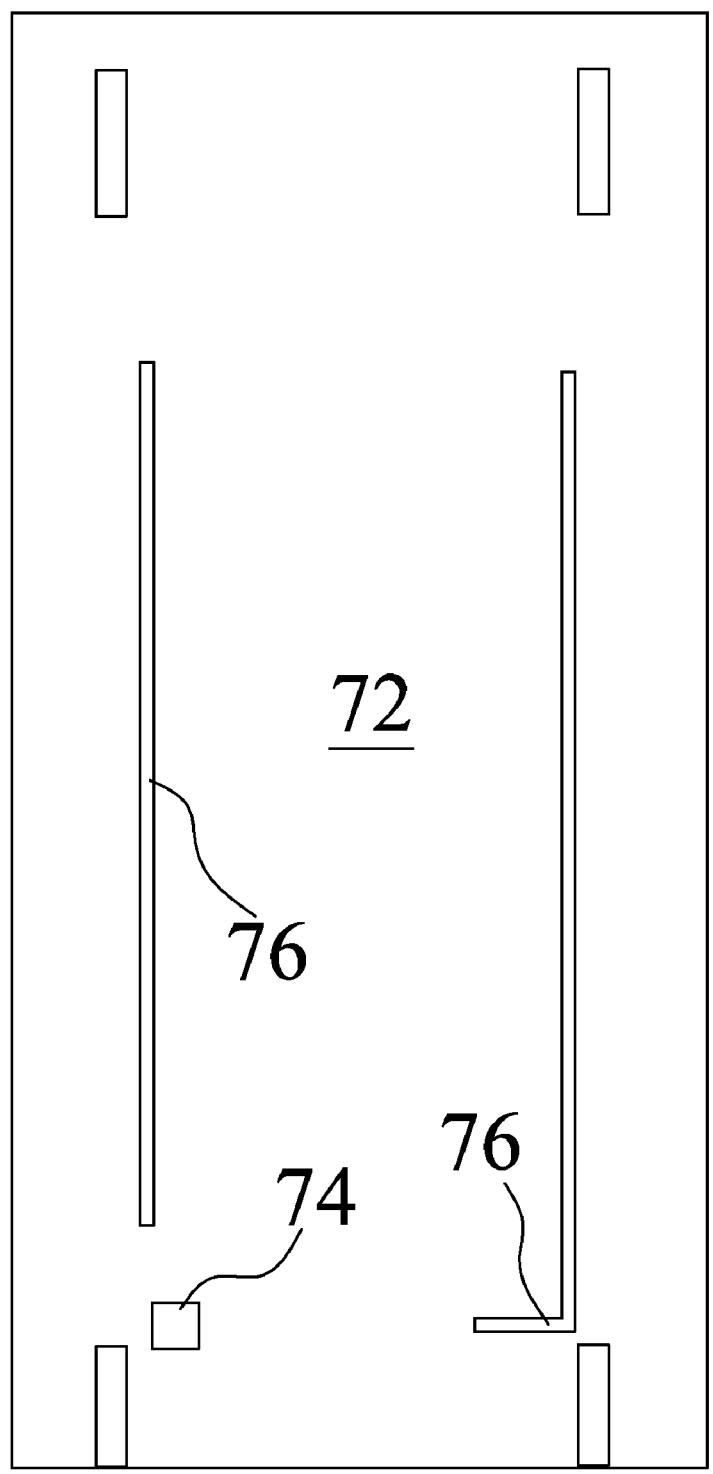
Figure 6C:
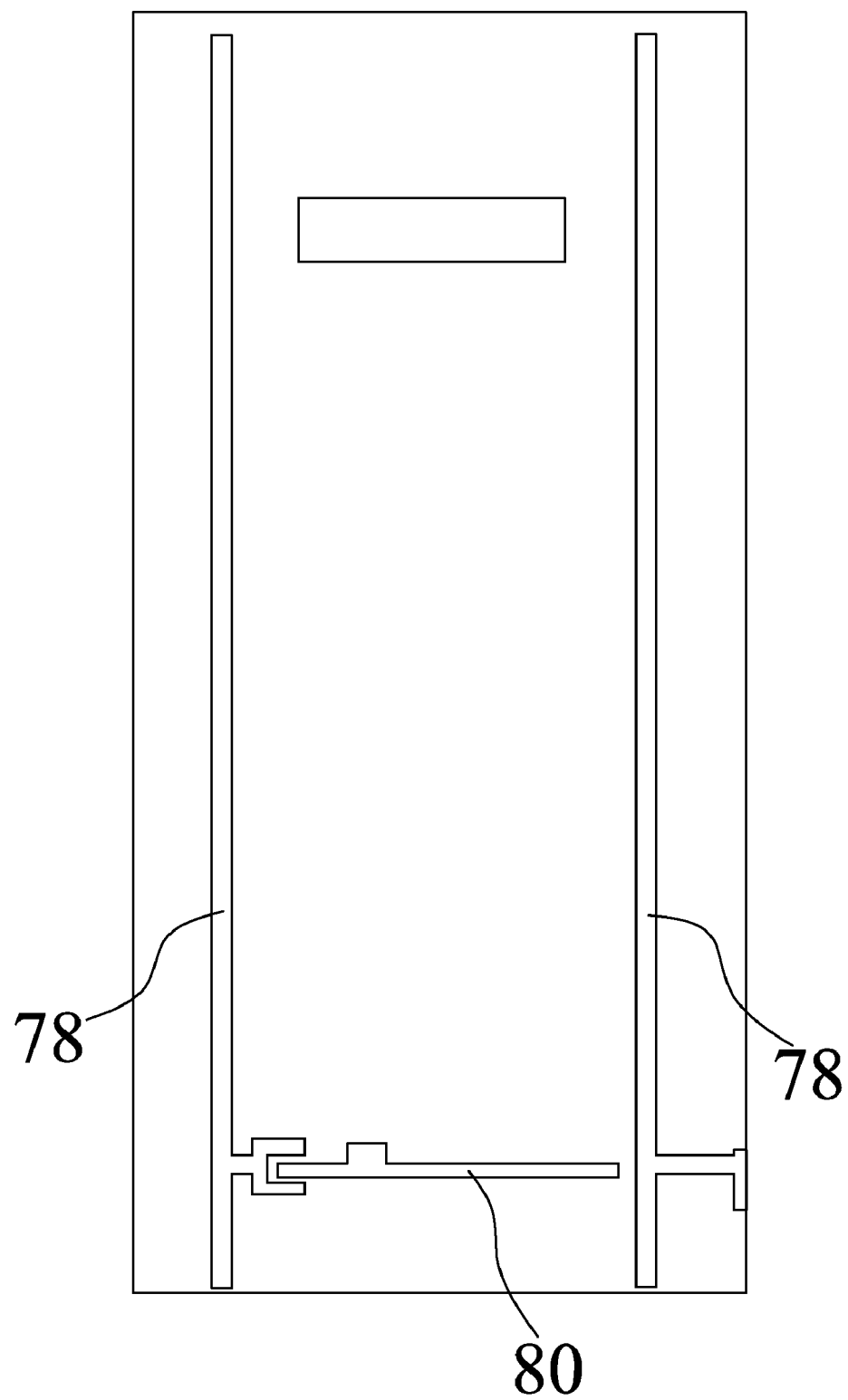
Figure 6D:
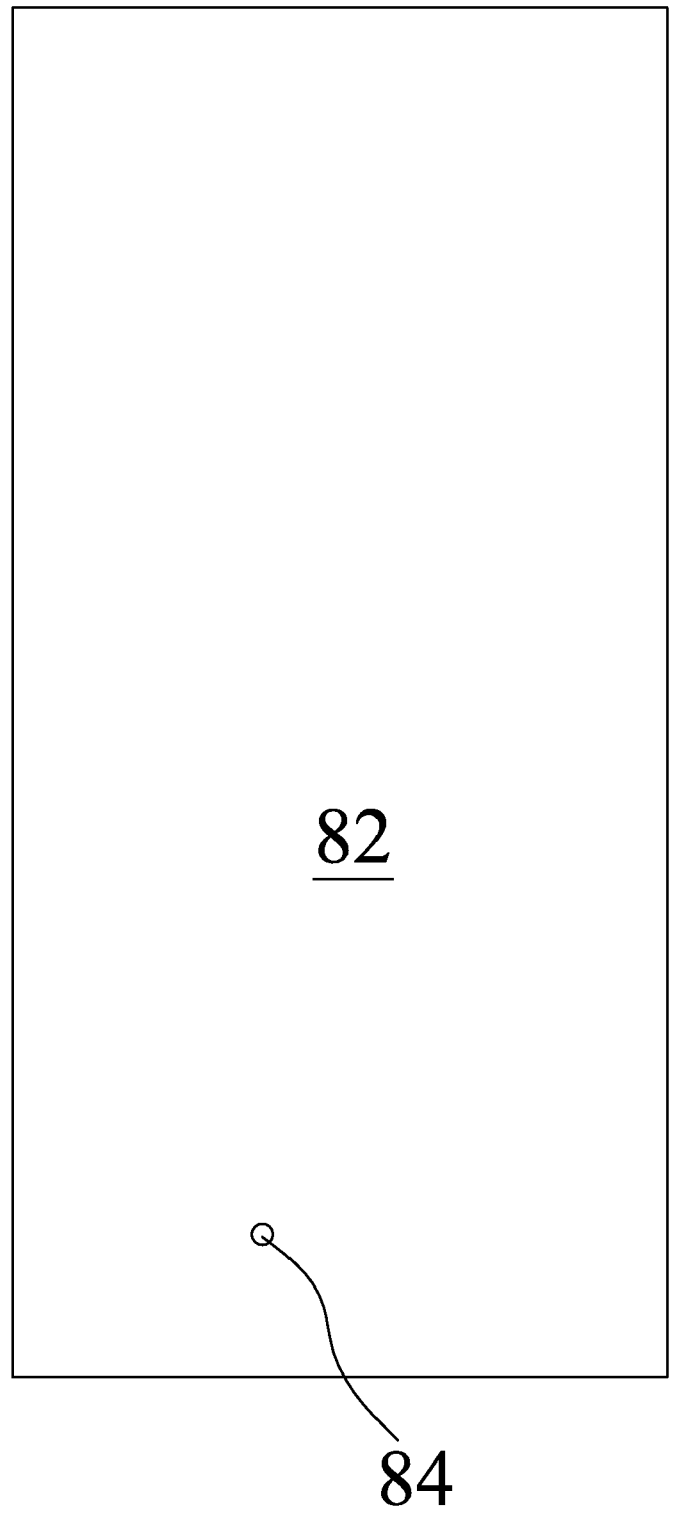
Figure 6E:
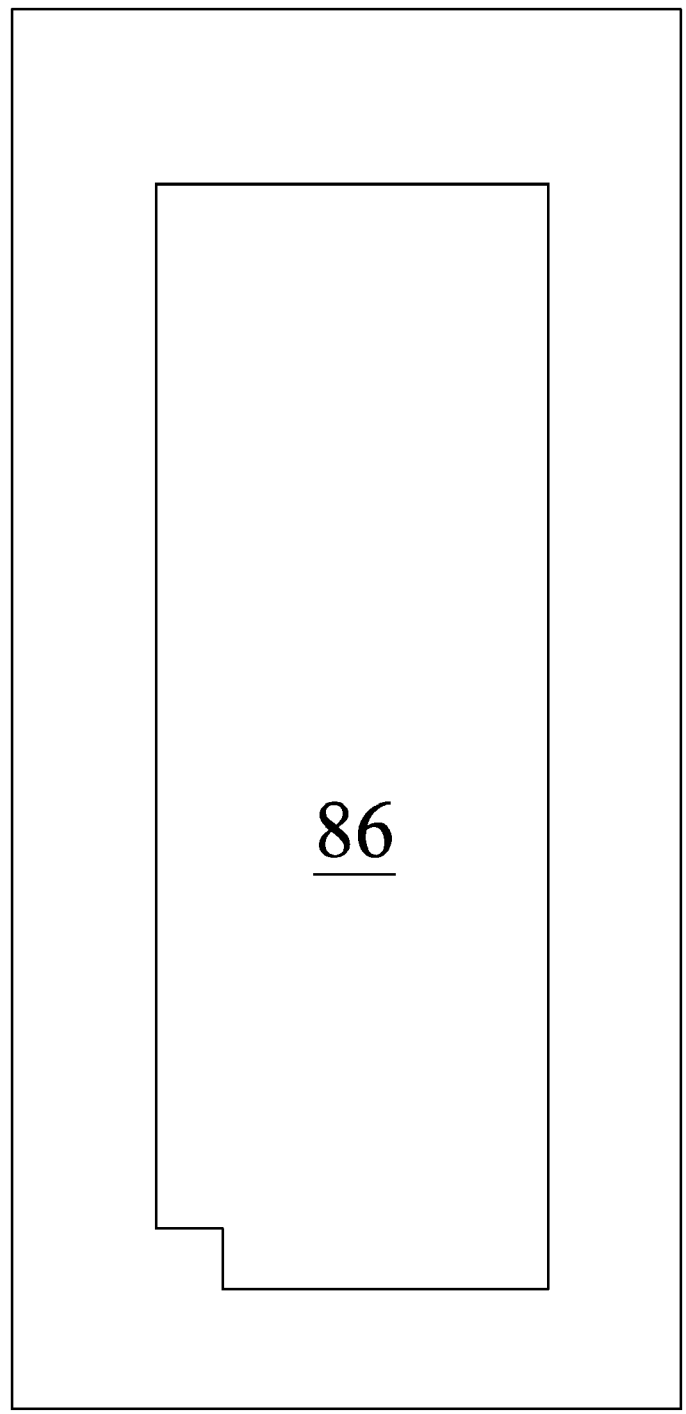
Figure 6F:
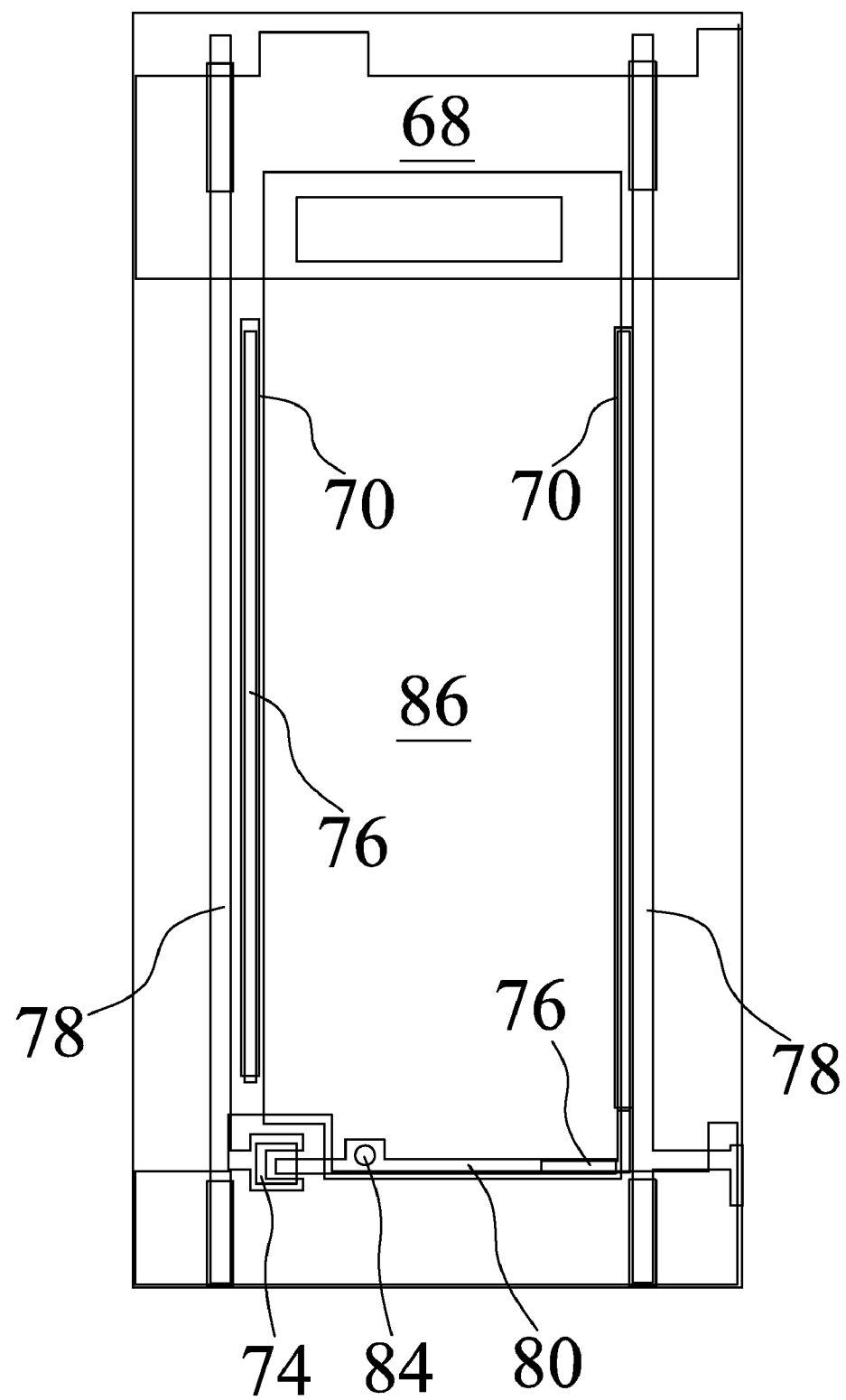

FIGS. 6A to 6F are the top views of pixel layout structures for each of the steps of a storage-capacitor-utilizing-gate-wiring (Cs on Gate) electrode structure manufacturing process according to an embodiment of the present invention. As shown in FIG. 6A, beginning with the first step by providing a transparent substrate 66, such as a glass substrate; then growing a first metal layer on the transparent substrate 66 before forming a gate line 68, a gate electrode of a transistor and a shadow layer 70, which is made of the first metal layer, through a wet etching or a dry etching. Next, referring to FIG. 6B, depositing a first insulation layer 72 on the first metal layer by means of Chemical Vapor Deposition (CVD); then, depositing an a-Si layer on the first insulation layer 72, and forming a channel 74 of a thin film transistor and an a-Si dummy layer 76 through a wet etching or a dry etching, the a-Si dummy layer 76 is located correspondingly over the shadow layer 70. Then, as FIG. 6C shows, growing a second metal layer on the a-Si layer, and forming a data line 78, a source electrode, and a drain electrode 80 of a transistor through a wet etching or a dry etching. Subsequently, referring to FIG. 6D, further depositing further a second insulation layer 82 on the second metal layer, and forming a plurality of through holes 84 through a wet etching or a dry etching, hereby electronically connecting a pixel and a storage capacitor. Finally, as FIG. 6E shows, the last step includes forming a transparent conductive layer 86 on the second insulation layer 82, such that the transparent conductive layer 86 is electronically connected with the drain electrode 80 via the through holes 84. The entire pixel layout structure obtained upon the completion of the above-mentioned processes is as shown in FIG. 6F.

Subsequently, the differences of technical characteristics of pixel layout structures of the prior art and the present invention are compared and explained in details as follows.

Figure 7A:
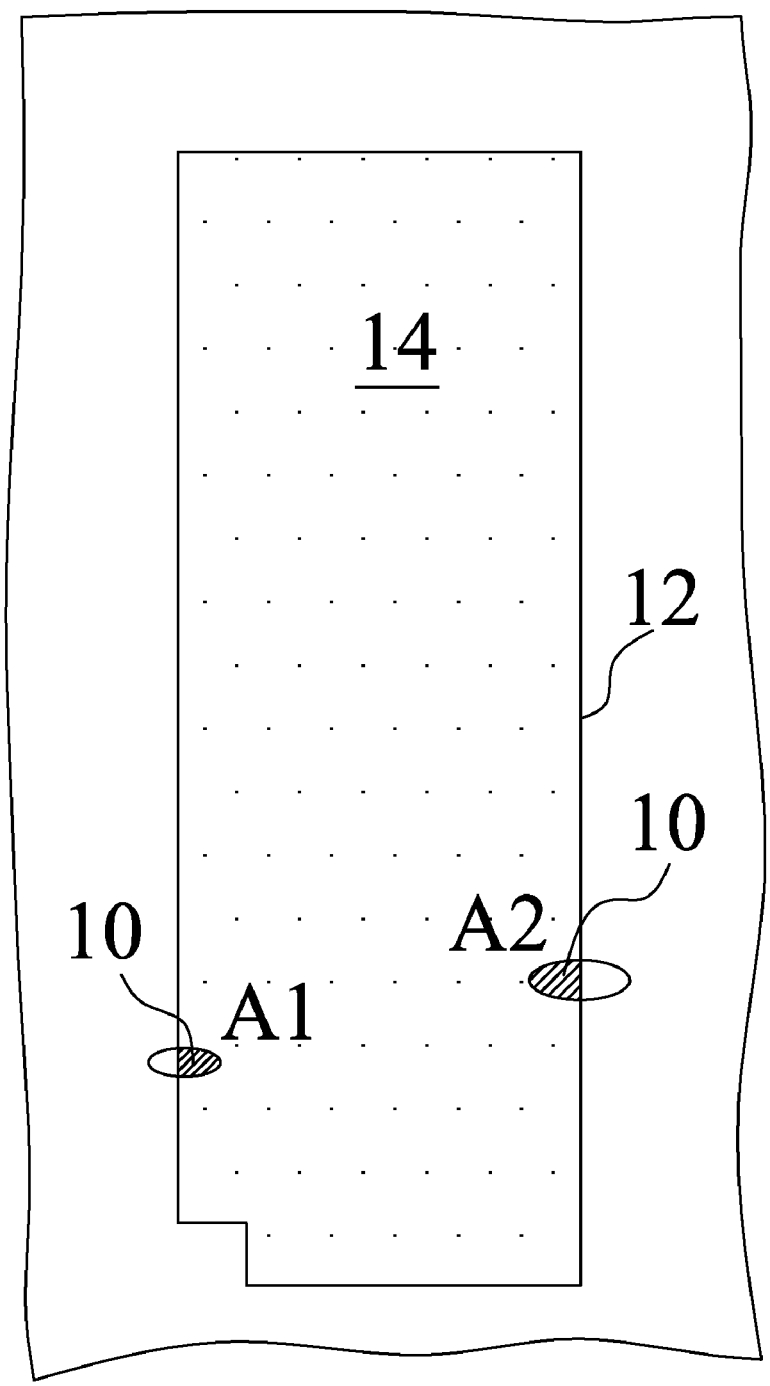
FIG. 7A is a schematic diagram of pixel structure having a-Si residue according to the prior art.

Firstly, FIG. 7A shows a schematic diagram of a pixel electrode structure having an a-Si residue according to the prior art. As shown in FIG. 7A, when a pixel has an a-Si residue 10 which overlaps data line 12, then a pixel transparent electrode layer 14, an insulation layer, and an a-Si residue 10 will form an effective area A1 or A2 for a capacitance coupling effect, this reverse direction capacitance coupling effect will result in an indirect current leakage effect to the charges of a pixel storage capacitor, and thus being liable to form pixel defects. Generally speaking, the voltage of this leakage current of a pixel created by the coupling effect is proportional to the coupling area A1 or A2 of the a-Si residue 10 and a reverse direction supply voltage provided by a data line 12; in case that the size of the coupled area A1 or A2 of a-Si residue 10 is excessive small, then the reverse direction capacitance coupling effect is relatively weak, so that an automatic array tester can not effectively detect the pixel defects.

Figure 7B:
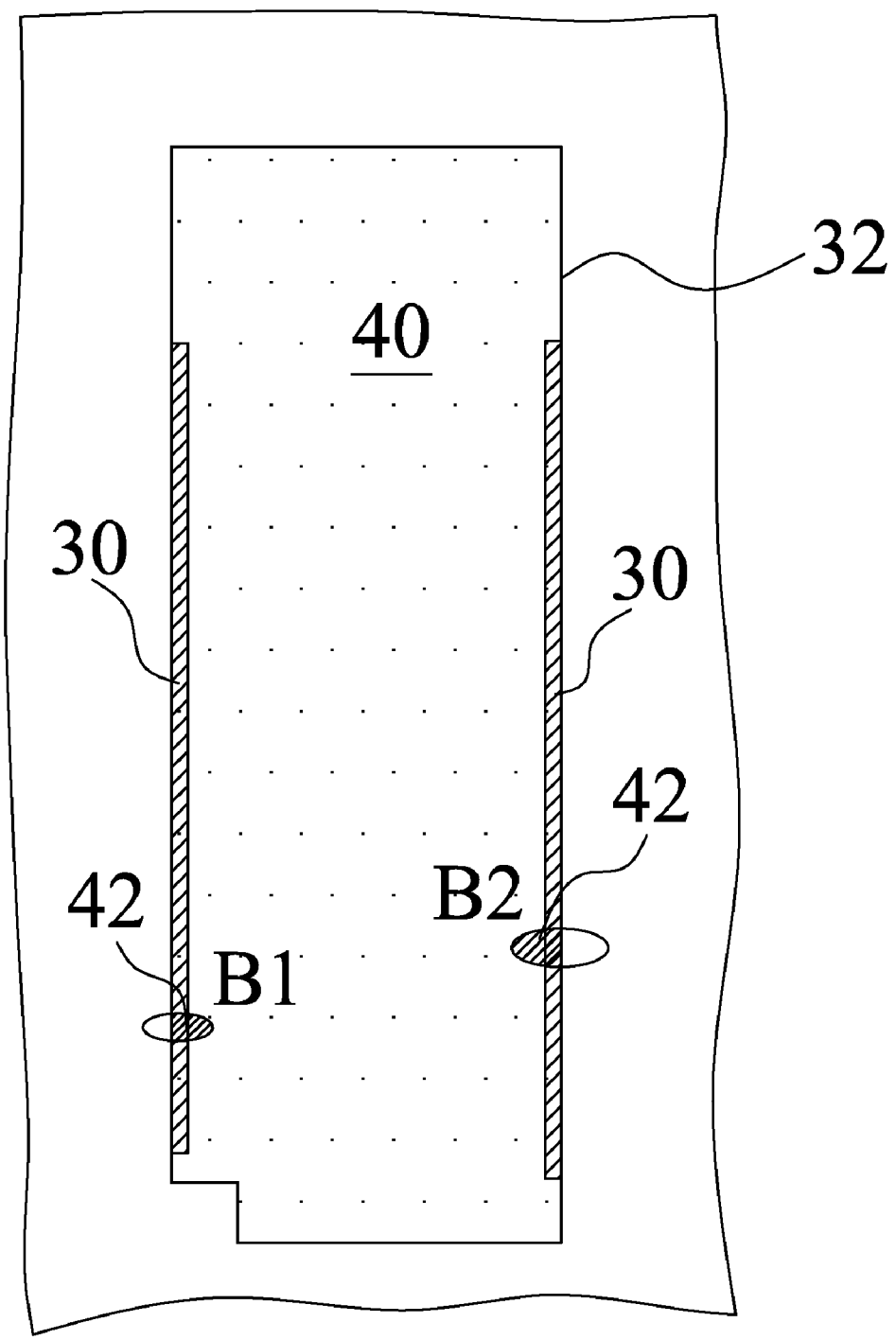
FIG. 7B is a schematic diagram of pixel structure having a-Si residue according to an embodiment of the present invention.

Subsequently, referring to FIG. 7B for a schematic diagram of a pixel electrode structure having an a-Si residue as shown in FIG. 3 according to an embodiment of the present invention. As shown in FIG. 7B, when a pixel has an a-Si residue 42 which overlaps a data line 32, the effective area of an a-Si residue 42 would be connected to the area of an additionally added a-Si dummy layer 30 in the present invention. Thus, at this time, the area formed by a transparent conductive layer 40, an insulation layer, an a-Si dummy layer 30, and an a-Si residue 42 will create a strong capacitance coupling effect B1 or B2, thus, this reverse direction capacitance coupling effect will create a strong indirect current leakage effect to the charges of a storage capacitor of a pixel, and this capacitance coupling effect is stronger than that generated merely by an a-Si residue area existing in a pixel under the conventional art, thus an a-Si residue can be detected easily by an automatic array tester, hereby effectively improving and raising the capability of an automatic array tester in detecting the pixel defects of a-Si residues.

In a process of manufacturing an existing thin film transistor circuit arrangement, a first metal layer (usually known as a metal shadow layer) originally arranged on both sides of a pixel are in a strip-shaped distribution, and that is used for light shadowing, gradient control during the process or pixel storage capacitor; however, in the present invention, an a-Si dummy layer is additionally provided over the metal layer, and the area of this a-Si dummy layer will not be added to increase the capacitance coupling area until there exists an a-Si residue in a pixel, yet in a normal condition, when there exists no a-Si residue in a pixel, thus there is no consideration for the overlapping of the a-Si residue on a data line, so it is not necessary to worry about the potential route of leakage current, therefore, the normal functions of a pixel will not be affected.

Summing up the above, in the present invention, a panel design layout which stresses on adding an additional a-Si dummy layer is adopted, so that in the conventional testing condition, in case that there exists a-Si residue in a pixel, the pixel defects can be detected through the increased capacitance coupling effect and electron conduction effect, thus effectively raising the capability of an automatic array tester in detecting the defective pixel having a-Si residue, hereby increasing the production yield, and enhancing the stability of panel quality control; as such, it may also reduce the repair workload of the subsequent Cell manufacturing process, hereby preventing the downgrading of the qualities of sold out products due to bright spots in a panel, increasing revenue of sales, and reducing the rejection of panel products as caused by the problems of bright spots.

The above detailed description of the preferred embodiment is intended to describe more clearly the characteristics and spirit of the present invention. However, the preferred embodiments disclosed above is not intended to be any restrictions to the scope of the present invention. Conversely, its purpose is to include the various changes and equivalent arrangements which are within the scope of the appended claims.

What is claimed is:

1. A pixel layout structure capable of increasing the capability of detecting amorphous silicon (a-Si) residue defects, comprising:
    a transparent substrate;
    a first metal layer disposed on said transparent substrate to form a pattern of a gate line, a gate electrode of a transistor and at least a shadow layer;
    a first insulation layer disposed on said first metal layer;
    an a-Si layer deposited on said first insulation layer to form a channel of said transistor, wherein said a-Si layer further includes at least a dummy layer disposed above said shadow layer;
    a second metal layer sputtered on said a-Si layer, so that a data line as well as a source electrode and a drain electrode of said transistor are formed and said dummy layer is located on one or both sides of the data line;
    said dummy layer further includes two strips, each of said strips is respectively disposed on said first insulation layer which is located at a lateral side of said data line, and under each of said dummy layers is correspondingly provided with said shadow layer;
    a second insulation layer disposed on said second metal layer that includes a plurality of through holes; and
    a transparent conductive layer located on said second insulation layer whereby said drain electrode of said transistor is electronically connected with said transparent conductive layer by means of said through holes.

2. The pixel layout structure as claimed in claim 1, wherein said transparent substrate is a glass substrate.

3. The pixel layout structure as claimed in claim 1, wherein said transistor is a thin film transistor.

4. The pixel layout structure as claimed in claim 1, wherein said first insulation layer is made of dielectric materials such as silicon oxide or silicon nitride.

5. The pixel layout structure as claimed in claim 1, wherein said second insulation layer is made of dielectric materials of silicon oxide or silicon nitride.

6. The pixel layout structure as claimed in claim 1, wherein said transistor is driven either by means of storage-capacitor-utilizing-common-wiring (Cs on Com) or by means of storage-capacitor-utilizing-gate-wiring (Cs on Gate).

7. The pixel layout structure as claimed in claim 1, wherein said second metal layer as well as said second insulation layer and said transparent conductive layer together form an electrode structure, whereby said electrode structure is a storage-capacitor-utilizing-common-wiring (Cs-on-Com) structure or a storage-capacitor-utilizing-gate-wiring (Cs on Gate) structure.

8. The pixel layout structure as claimed in claim 7, wherein in case that said electrode structure is said storage-capacitor-utilizing-common-wiring (Cs on Com) structure, said electrode structure has a layout design which is chosen from a metal layer-insulation layer-ITO layer (MII) electrode structure, a metal layer-insulation layer-semiconductor layer (MIS) electrode structure, and a metal layer-insulation layer-metal layer (MIM) electrode structure.

* * * * *